United States Patent
Li et al.

(10) Patent No.: US 6,806,185 B2
(45) Date of Patent: Oct. 19, 2004

(54) METHOD FOR FORMING LOW DIELECTRIC CONSTANT DAMASCENE STRUCTURE WHILE EMPLOYING A CARBON DOPED SILICON OXIDE CAPPING LAYER

(75) Inventors: Lain-Jong Li, Hsin-Chu (TW); Chung-Chi Ko, Nantou (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/246,895

(22) Filed: Sep. 19, 2002

(65) Prior Publication Data

US 2004/0058523 A1 Mar. 25, 2004

(51) Int. Cl.$^7$ .......................................... H01L 21/4763
(52) U.S. Cl. ..................... 438/637; 438/645; 438/687
(58) Field of Search ................................ 438/637, 597, 438/621, 622, 623, 624, 631, 633, 645, 687, 780, 789

(56) References Cited

U.S. PATENT DOCUMENTS

| | | | |
|---|---|---|---|
| 6,072,227 A | 6/2000 | Yau et al. | |
| 6,107,184 A | 8/2000 | Mandal et al. | |
| 6,114,259 A | 9/2000 | Sukharev et al. | |
| 6,171,945 B1 | 1/2001 | Mandal et al. | |
| 6,407,013 B1 * | 6/2002 | Li et al. | 438/788 |
| 6,455,417 B1 * | 9/2002 | Bao et al. | 438/637 |

* cited by examiner

Primary Examiner—Jack Chen
(74) Attorney, Agent, or Firm—Tung & Associates

(57) ABSTRACT

Within a damascene method for forming a patterned conductor layer having formed interposed between its patterns a patterned dielectric layer formed of a comparatively low dielectric constant dielectric material method, there is employed a patterned capping layer formed upon the patterned dielectric layer. The patterned capping layer is formed employing a plasma enhanced chemical vapor deposition (PECVD) method in turn employing an organosilane carbon and silicon source material, a substrate temperature of from about 0 to about 200 degrees centigrade and a radio frequency power of from about 100 to about 1000 watts per square centimeter substrate area. The patterned capping layer provides for attenuated abrasive damage to the dielectric layer incident to the damascene method and is typically partially planarized incident to the damascene method.

15 Claims, 1 Drawing Sheet

METHOD FOR FORMING LOW DIELECTRIC CONSTANT DAMASCENE STRUCTURE WHILE EMPLOYING A CARBON DOPED SILICON OXIDE CAPPING LAYER

BACKGROUND OF THE INVENTION

1. Field of the Invention

The present invention relates generally to methods for forming damascene structures within microelectronic fabrications. More particularly, the present invention relates to methods for forming low dielectric constant damascene structures within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly common in the art of microelectronic fabrication to employ interposed between the patterns of patterned microelectronic conductor layers when fabricating microelectronic fabrications microelectronic dielectric layers formed of comparatively low dielectric constant dielectric materials, such comparatively low dielectric constant dielectric materials generally having dielectric constants in a range of from about 2.0 to less than about 3.0. For comparison purposes, microelectronic dielectric layers formed within microelectronic fabrications from conventional silicon oxide dielectric materials, silicon nitride dielectric materials and silicon oxynitride dielectric materials typically have comparatively high dielectric constants in a range of from greater than about 4.0 to about 8.0. Similarly, such patterned microelectronic conductor layers having formed interposed between their patterns microelectronic dielectric layers formed of comparatively low dielectric constant dielectric materials are typically formed within microelectronic fabrications while employing damascene methods, including in particular dual damascene methods.

Microelectronic dielectric layers formed of comparatively low dielectric constant dielectric materials are desirable in the art of microelectronic fabrication formed interposed between the patterns of patterned microelectronic conductor layers within microelectronic fabrications insofar as such microelectronic dielectric layers formed of dielectric materials having comparatively low dielectric constants provide microelectronic fabrications which may theoretically operate at higher microelectronic fabrication speeds, with attenuated patterned microelectronic conductor layer parasitic capacitance and attenuated patterned microelectronic conductor layer cross-talk.

Similarly, damascene methods are desirable in the art of microelectronic fabrication for forming patterned microelectronic conductor layers having formed interposed between their patterns microelectronic dielectric layers formed of comparatively low dielectric constant dielectric materials insofar as damascene methods are comparatively simple fabrication methods which may often be employed to fabricate microelectronic structures which are not otherwise practicably accessible in the art of microelectronic fabrication.

While damascene methods are thus desirable in the art of microelectronic fabrication for forming patterned microelectronic conductor layers having formed interposed between their patterns microelectronic dielectric layers formed of comparatively low dielectric constant dielectric materials within microelectronic fabrications, damascene methods are nonetheless not entirely without problems in the art of microelectronic fabrication for forming patterned microelectronic conductor layers having formed interposed between their patterns microelectronic dielectric layers formed of comparatively low dielectric constant dielectric materials within microelectronic fabrications. In that regard, while damascene methods are generally successful for forming patterned microelectronic conductor layers having formed interposed between their patterns microelectronic dielectric layers formed of comparatively low dielectric constant dielectric materials within microelectronic fabrications, such damascene methods often provide abrasive damage, such as but not limited to voids, to the microelectronic dielectric layers formed of the comparatively low dielectric constant dielectric materials.

It is thus desirable in the art of microelectronic fabrication to provide damascene methods which may be employed in the art of microelectronic fabrication for providing patterned microelectronic conductor layers having formed interposed between their patterns microelectronic dielectric layers formed of comparatively low dielectric constant dielectric materials, with attenuated abrasive damage to the microelectronic dielectric layers formed of the comparatively low dielectric constant dielectric materials.

It is towards the foregoing object that the present invention is directed.

Various methods and apparatus have been disclosed in the art of microelectronic fabrication for forming microelectronic layers, and in particular microelectronic dielectric layers, with desirable properties in the art of microelectronic fabrication.

Included among the methods and apparatus, but not limited among the methods and apparatus, are methods and apparatus disclosed within: (1) Yau et al., in U.S. Pat. No. 6,072,227 (a method and an apparatus for forming within a microelectronic fabrication, and with enhanced barrier properties and enhanced etch stop properties, a microelectronic dielectric layer formed of a lower dielectric constant dielectric material formed employing a plasma enhanced chemical vapor deposition (PECVD) method employing a silicon source material comprising an organosilane, preferably methylsilane, along with an oxidant source material, preferably nitrous oxide; (2) Mandal et al., in U.S. Pat. No. 6,107,184 and U.S. Pat. No. 6,171,945 (methods and apparatus for forming within a microelectronic fabrication a microelectronic dielectric layer formed of a comparatively low dielectric constant dielectric material comprising a nanoporous organic copolymer dielectric material or a nanoporous silicon oxide based dielectric material; and (3) Sukharev et al., in U.S. Pat. No. 6,114,259 (a method for treating within a microelectronic fabrication exposed portions of a microelectronic dielectric layer formed of a comparatively low dielectric constant carbon doped silicon oxide dielectric material such as to avoid subsequent oxidizing plasma etch damage to the microelectronic dielectric layer).

Desirable in the art of microelectronic fabrication are damascene methods and materials which may be employed in the art of microelectronic fabrication for providing patterned microelectronic conductor layers having formed interposed between their patterns microelectronic dielectric layers formed of comparatively low dielectric constant dielectric materials, with attenuated abrasive damage to the microelectronic dielectric layers.

It is towards the foregoing object that the present invention is directed.

SUMMARY OF THE INVENTION

A first object of the present invention is to provide a damascene method for forming within a microelectronic fabrication a patterned microelectronic conductor layer having formed interposed between its patterns a microelectronic dielectric layer formed of a comparatively low dielectric constant dielectric material.

A second object of the present invention is to provide a damascene method in accord with the first object of the present invention, wherein the patterned microelectronic conductor layer is formed with attenuated abrasive damage to the microelectronic dielectric layer.

A third object of the present invention is to provide a damascene method in accord with the first object of the present invention and the second object of the present invention, wherein the damascene method is readily commercially implemented.

In accord with the objects of the present invention, there is provided by the present invention a damascene method for forming a patterned microelectronic conductor layer within a microelectronic fabrication.

To practice the method of the present invention, there is first provided a substrate. There is then formed over the substrate a patterned dielectric layer formed of a comparatively low dielectric constant dielectric material. There is also formed aligned upon the patterned dielectric layer a patterned capping layer formed of a carbon doped silicon oxide dielectric material formed employing a plasma enhanced chemical vapor deposition (PECVD) method in turn employing an organosilane carbon and silicon source material, a substrate temperature of from about 0 to about 200 degrees centigrade and a radio frequency deposition power of from about 100 to about 500 watts per square centimeter substrate area. Within the present invention, the patterned dielectric layer and the patterned capping layer define an aperture. Finally, there is then formed into the aperture a patterned conductor layer while employing a damascene method.

There is provided by the present invention a damascene method for forming within a microelectronic fabrication a patterned microelectronic conductor layer having formed interposed between its patterns a microelectronic dielectric layer formed of a comparatively low dielectric constant dielectric material, wherein the patterned microelectronic conductor layer is formed with attenuated abrasive damage to the microelectronic dielectric layer.

The present invention realizes the foregoing object by employing within the damascene method, and formed aligned upon a patterned dielectric layer, a patterned capping layer, where the patterned dielectric layer and the patterned capping layer define an aperture within which is formed the patterned conductor layer while employing the damascene method. Within the method of the present invention, the patterned capping layer is formed of a carbon doped silicon oxide material formed employing a plasma enhanced chemical vapor deposition (PECVD) method in turn employing an organosilane carbon and silicon source material, a substrate temperature of from about 0 to about 200 degrees centigrade and a radio frequency deposition power of from about 100 to about 500 watts per square centimeter substrate area.

The damascene method in accord with the present invention is readily commercially implemented.

As will be illustrated in greater detail within the context of the Description of the Preferred Embodiment, as set forth below, the damascene method of the present invention employs methods and materials as are otherwise generally known in the art of microelectronic fabrication, but employed within the context of specific process limitations to provide the damascene method of the present invention. Since it is thus at least in part a series of specific process limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

There is provided by the present invention a damascene method for forming within a microelectronic fabrication a patterned microelectronic conductor layer having formed interposed between its patterns a microelectronic dielectric layer formed of a comparatively low dielectric constant dielectric material, wherein the patterned microelectronic conductor layer is formed with attenuated abrasive damage to the microelectronic dielectric layer.

The present invention realizes the foregoing object by employing within the damascene method, and formed aligned upon a patterned dielectric layer, a patterned capping layer, where the patterned dielectric layer and the patterned capping layer define an aperture within which is formed the patterned conductor layer while employing the damascene method. Within the method of the present invention, the patterned capping layer is formed of a carbon doped silicon oxide material formed employing a plasma enhanced chemical vapor deposition (PECVD) method in turn employing an organosilane carbon and silicon source material, a substrate temperature of from about 0 to about 200 degrees centigrade and a radio frequency deposition power of from about 100 to about 500 watts per square centimeter substrate area.

Although the preferred embodiment of the present invention provides particular value within the context of forming, while employing a damascene method, and within a semiconductor integrated circuit microelectronic fabrication, a patterned microelectronic conductor layer having formed interposed between its patterns a microelectronic dielectric layer formed of a comparatively low dielectric constant dielectric material, the present invention may nonetheless be employed for forming patterned conductor layers within microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 4, there is shown a series of schematic cross-sectional diagrams illustrating the results of progressive stages in forming, in accord with a preferred embodiment of the present invention, a patterned microelectronic conductor layer within a microelectronic fabrication while employing a damascene method.

Figure 1:
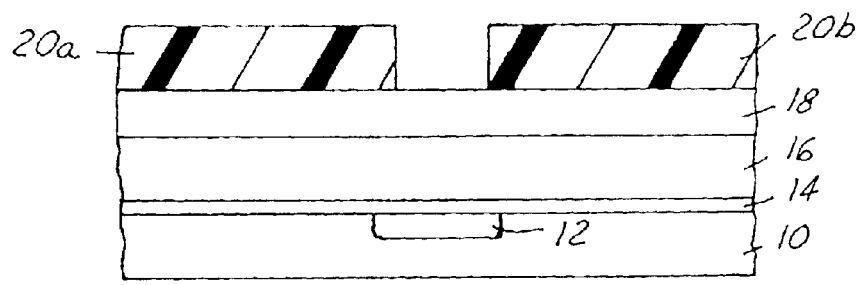
FIG. 1, FIG. 2, FIG. 3 and FIG. 4 show a series of schematic cross-sectional diagrams illustrating the results of progressive stages of forming, in accord with a preferred embodiment of the present invention, a patterned conductor layer within a microelectronic fabrication.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed therein a contact region 12.

Within the preferred embodiment of the present invention with respect to the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in an alternative, the substrate 10 may comprise a substrate as employed within the microelectronic fabrication, wherein the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

In addition, and although also not specifically illustrated within the schematic cross-sectional diagram of FIG. 1, the substrate 10, typically and preferably, but not exclusively, when the substrate 10 consists of or comprises a semiconductor substrate as employed within a semiconductor integrated circuit microelectronic fabrication, has formed therein and/or thereupon microelectronic devices as are similarly also conventional within the microelectronic fabrication within which is employed the substrate 10. Such microelectronic devices may be selected from the group including but not limited to resistors, transistors, diodes and capacitors.

Within the preferred embodiment of the present invention with respect to the contact region 12, the contact region 12 is typically and preferably either: (1) a semiconductor contact region, particularly under circumstances where the substrate 10 consists of or comprises a semiconductor substrate as employed within a semiconductor integrated circuit microelectronic fabrication; or (2) a conductor contact region, under circumstances where the substrate 10 is employed within any of the several microelectronic fabrications as noted above.

Shown also within the schematic cross-sectional diagram of FIG. 1, and formed upon the substrate 10 having formed therein the contact region 12, is a series of blanket layers comprising: (1) an optional blanket liner layer 14 formed upon the substrate 10 having formed therein the contact region 12; (2) a blanket dielectric layer 16 formed upon the blanket liner layer 14; and (3) a blanket capping layer 18 formed upon the blanket dielectric layer 16. Finally, there is also shown within the schematic cross-sectional diagram of FIG. 1, and formed upon the blanket capping layer 18, a pair of patterned photoresist layers 20a and 20b.

Within the preferred embodiment of the present invention, and with respect to the blanket liner layer 14, the blanket liner layer 14 may be formed from any of several liner materials as are conventional in the art of microelectronic fabrication, and in particular from generally thin layers of barrier dielectric liner materials, such as but not limited to silicon oxide dielectric liner materials, silicon nitride dielectric liner materials and silicon oxynitride dielectric liner materials. The blanket liner layer 14 may also be formed of comparatively lower dielectric constant materials provided that they serve adequately as liner materials, and may thus also be formed of the same material as the blanket capping layer 18, as discussed in greater detail below. Typically and preferably, the blanket liner layer 14 is formed to a thickness of from about 100 to about 600 angstroms, more preferably from about 200 to about 500 angstroms and most preferably from about 300 to about 500 angstroms.

Within the preferred embodiment of the present invention with respect to the blanket dielectric layer 16, and while the blanket dielectric layer 16 may be formed from any of several comparatively low dielectric constant dielectric materials as are conventional or unconventional in the art of microelectronic fabrication, including but not limited to spin-on-glass (SOG) dielectric materials, spin-on-polymer (SOP) dielectric materials, nanoporous dielectric materials, amorphous carbon dielectric materials and fluorosilicate glass (FSG) dielectric materials, the present invention provides particular value under circumstances where the blanket dielectric layer 16 is formed of a porous dielectric material, and in particular a nanoporous dielectric material, generally having a particularly low dielectric constant in a range of from about 2.0 to about 3.0. Such nanoporous dielectric materials are often fragile dielectric materials, and they are disclosed in greater within Mandal et al., as cited within the Description of the Related Art, all of which related art is incorporated herein by reference. Typically and preferably, the blanket dielectric layer 16 is formed to a thickness of from about 1000 to about 10000 angstroms.

Within the preferred embodiment of the present invention with respect to the blanket capping layer 18, the blanket capping layer 18 is formed of a carbon doped silicon oxide dielectric material formed employing a plasma enhanced chemical vapor deposition (PECVD) method in turn employing an organosilane carbon and silicon source material and an oxidant source material (which may be intrinsic to the organosilane carbon and silicon source material), while further employing a substrate 10 temperature of from about 0 to about 200 degrees centigrade, more preferably from about 0 to about 150 degrees centigrade and most preferably from about 50 to about 100 degrees centigrade and a radio frequency deposition power of from about 100 to about 500 watts per square centimeter substrate 10 area, more preferably from about 200 to about 800 watts per square centimeter substrate 10 area and most preferably from about 300 to about 600 watts per square centimeter substrate 10 area, to provide the blanket capping layer 18 of the carbon doped silicon oxide material having a dielectric constant of from about 2.5 to about 2.9. Deposition temperatures in a range of from about zero to about 500 degrees centigrade and from about 200 to about 500 degrees centigrade may, however, also be employed.

Within the preferred embodiment of the present invention, and although any of several organosilanes may be employed when forming the blanket capping layer 18, including but not limited to alkylorganosilanes, arylorganosilanes and alkylarylorganosilanes as are disclosed within Yau et al, as cited within the Description of the Related Art, the teachings of all of which related art are incorporated herein fully by reference, typically and preferably the organosilane is trimethylsilane, but not an azidosilane. Similarly, within the present invention and the preferred embodiment of the present invention, an organosilane is intended as a carbon and silicon containing molecule with up to four carbon-silicon bonds with respect to a single silicon atom, with the remainder carbon-hydrogen bonds, and is not intended to include carbon, silicon and oxygen containing molecules, such as but not limited to tetraethylorthosilicate (TEOS), which comprise oxygen-silicon bonds.

In addition, although any of several oxidant source materials may also be employed when forming the blanket capping layer 18, including but not limited to oxygen, ozone, nitrous oxide and nitric oxide, typically and preferably, the oxidant source material is nitrous oxide.

Typically and preferably, the plasma enhanced chemical vapor deposition (PECVD) method for forming the blanket capping layer 18, also employs: (1) a trimethlysilane organosilane carbon and silicon source material flow rate of from about 100 to about 1000 standard cubic centimeters per minute (sccm); (2) a nitrous oxide oxidant source material flow rate of from about 100 to about 1000 standard cubic centimeters per minute (sccm); and (3) a background helium, nitrogen or argon diluent flow rate of from about 100 to about 1000 standard cubic centimeters per minute (sccm).

As is understood by a person skilled in the art, and within the context of the present invention and the preferred embodiment of the present invention, the blanket dielectric layer 16 is not formed of the same carbon doped silicon oxide material as is employed for forming the blanket capping layer 18. Similarly, and for reasons which may become clearer in accord with the additional disclosure which follows, the carbon doped silicon oxide material from which is formed the blanket capping layer 18 will typically and preferably have a higher (but still generally comparatively low) dielectric constant in comparison with the dielectric material from which is formed the blanket dielectric layer 16.

Finally, within the preferred embodiment of the present invention with respect to the pair of patterned photoresist layers 20a and 20b, the pair of patterned photoresist layers 20a and 20b may be formed from any of several photoresist materials as are conventional in the art of microelectronic fabrication, including but not limited to photoresist materials selected from the general groups of photoresist materials including but not limited to positive photoresist materials and negative photoresist materials. Typically and preferably, each of the pair of patterned photoresist layers 20a and 20b is formed to a thickness of from about 100 to about 1000 angstroms.

Figure 2:
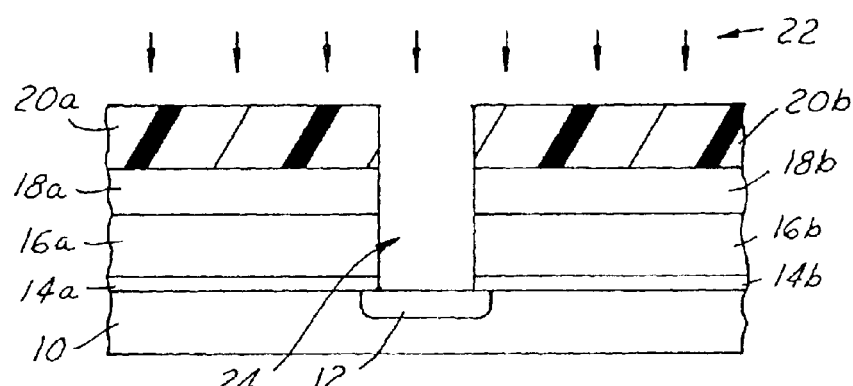

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein the series of blanket layers comprising: (1) the blanket capping layer 18, formed upon; (2) the blanket dielectric layer 16, in turn formed upon; (3) the blanket liner layer 14, has been patterned for form a corresponding series of pairs of patterned layers comprising: (1) a pair of patterned capping layers 18a and 18b, formed upon (2) a pair of patterned dielectric layers 16a and 16b, in turn formed upon (3) a pair of patterned liner layers 14a and 14b, while employing the pair of patterned photoresist layers 20a and 20b as a pair of etch mask layers, in conjunction with an etching plasma 22. As is illustrated within the schematic cross-sectional diagram of FIG. 2, the pair of patterned liner layers 14a and 14b, the pair of patterned dielectric layers 16a and 16b and the pair of patterned capping layers 18a and 18b define, in an aggregate, an aperture 24.

Within the preferred embodiment of the present invention with respect to the etching plasma 22, the etching plasma 22 may employ an etchant gas composition (or a series of etchant gas compositions) as is conventional or unconventional in the art of microelectronic fabrication for etching the materials from which are formed the series of blanket layers comprising: (1) the blanket capping layer 18; (2) the blanket dielectric layer 16; and (3) the blanket liner layer 14. At least with respect to the blanket capping layer 18, the etching plasma 22 will typically and preferably employ a fluorine containing etchant gas, in conjunction with an argon sputtering gas.

Typically and preferably, with respect to etching at least the blanket capping layer 18 when formed upon an eight inch diameter substrate 10 to provide the pair of pair of patterned hard capping layers 18a and 18b, the etching plasma 22 will also employ: (1) a reactor chamber pressure of from about 500 to about 700 mTorr; (2) a source radio frequency power of from about 100 to about 500 watts and a bias power of from about 50 to about 500 watts; (3) at least in part a carbon tetrafluoride fluorine containing etchant gas at a flow rate of from about 100 to about 1000 standard cubic centimeters per minute (sccm); and (4) an argon sputter gas at a flow rate of from about 100 to about 1000 standard cubic centimeters per minute (sccm).

Figure 3:
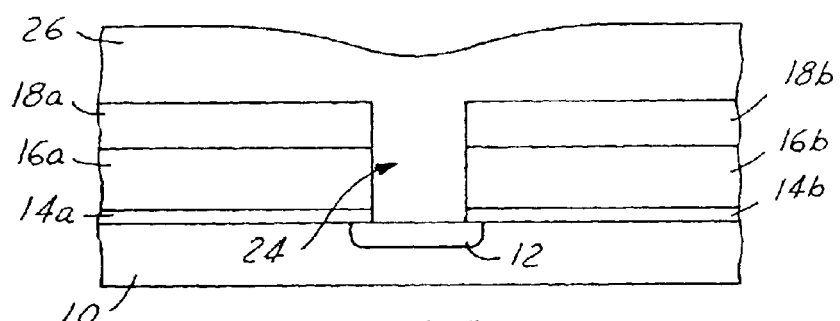

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein, in a first instance, the pair of patterned photoresist layers 20a and 20b has been stripped from the microelectronic fabrication.

Within the present invention and preferred embodiment of the present invention, the pair of patterned photoresist layers 20a and 20b may be stripped from the microelectronic fabrication whose schematic cross-sectional diagram is illustrated in FIG. 2 to provide in part the microelectronic fabrication whose schematic cross-sectional diagram is illustrated in FIG. 3 while employing photoresist stripping methods as are otherwise conventional in the art of microelectronic fabrication. Such photoresist stripping methods may be selected from the group including but not limited to wet chemical photoresist stripping methods, dry plasma photoresist stripping methods and aggregate photoresist stripping methods thereof.

Similarly, there is also shown within the schematic cross-sectional diagram of FIG. 3, and formed upon exposed portions of the pair of patterned capping layers 18a and 18b, the pair of patterned dielectric layers 16a and 16b, the pair of patterned liner layers 14a and 14b and the contact region 12, a blanket conductor layer 26 which completely fills the aperture 24.

Within the preferred embodiment of the present invention with respect to the blanket conductor layer 26, the blanket conductor layer 26 may be formed of conductor materials as are conventional or unconventional in the art of microelectronic fabrication, such conductor materials being selected from the group including but not limited to metal and metal alloy conductor materials, more particularly aluminum, aluminum alloy, copper or copper alloy conductor materials, and most preferably copper or copper alloy (having a copper content of at least about 90 weight percent) conductor materials. Typically and preferably, the blanket conductor layer 26 is formed to a thickness of from about 3000 to about 8500 angstroms and will typically and preferably include, formed as its lower portion, a blanket barrier layer, to thus inhibit interdiffusion of the conductor material from which is formed the main portion of the blanket conductor layer 26 with any of the materials from which are formed adjoining layers within the microelectronic fabrication whose schematic cross-sectional diagram is illustrated in FIG. 3.

Figure 4:
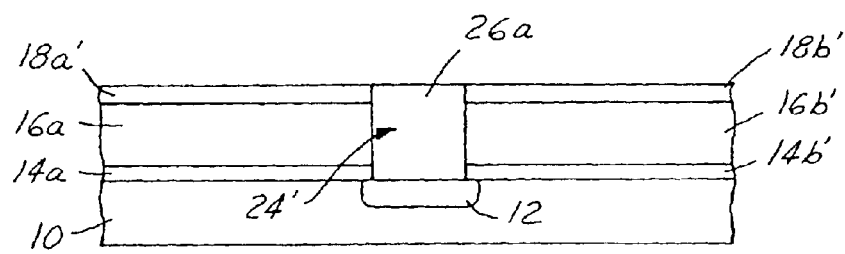

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the blanket conductor layer 26 has been completely planarized and the pair of patterned capping layers 18a and 18b has been partially planarized, to form a patterned planarized conductor layer 26a within a diminished aperture 24' defined by the pair of patterned liner layers 14a and 14b, the pair of dielectric layers 16a and 16b and a pair of partially planarized patterned capping layers 18a' and 18b'. Within the present invention and the preferred embodiment of the present invention, the blanket conductor layer 26 may be completely planarized and the pair of patterned capping layers 18a and 18b may be partially planarized (to a resulting thickness of from about 100 to about 1000 angstroms) to form the patterned planarized conductor layer 26a within the diminished aperture 24' while employing methods as are conventional in the art of microelectronic fabrication, and in particular chemical mechanical polish (CMP) planarizing methods.

Typically and preferably, the chemical mechanical polish planarizing methods will employ an silica based chemical mechanical polish (CMP) planarizing slurry composition.

Upon forming the microelectronic fabrication whose schematic cross-sectional diagram is illustrated in FIG. 4, there is formed within a microelectronic fabrication, while employing a damascene method, a patterned conductor layer having interposed between its patterns a dielectric layer formed of a comparatively low dielectric constant dielectric material within the microelectronic fabrication, with attenuated physical abrasion of the dielectric layer. The present invention realizes the foregoing object by employing when fabricating the patterned conductor layer while employing the damascene method a patterned capping layer formed aligned upon a patterned dielectric layer, wherein the patterned capping layer is formed from a carbon doped silicon oxide material formed employing a plasma enhanced chemical vapor deposition (PECVD) method in turn employing an organosilane carbon and silicon source material, preferably trimethylsilane.

Further in accord with the present invention, the patterned capping layer is partially planarized while forming the patterned conductor layer within the aperture to provide a partially planarized patterned capping layer which in turn protects the patterned dielectric layer from physical abrasion incident to forming the patterned conductor layer while employing the damascene method.

As is understood by a person skilled in the art, although the preferred embodiment of the present invention illustrates the present invention within the context of a patterned conductor layer having formed interposed between its patterns a dielectric layer formed of a comparatively low dielectric constant dielectric material further within the context of a single damascene method, the present invention may also be applied within the context of dual damascene methods and higher order damascene methods, as are more specifically illustrated within the references cited within the Description of the Related Art.

As is further understood by a person skilled in the art, the preferred embodiment of the present invention is illustrative of the present invention rather than limiting of the present invention. Revisions and modifications may be made to methods, materials, structures and dimensions through which is provided a patterned conductor layer in accord with the preferred embodiment of the present invention, which still providing a method for forming a patterned conductor layer in accord with the present invention, further in accord with the accompanying claims.

What is claimed is:

1. A damascene method for forming a patterned conductor layer comprising:
    providing a substrate;
    forming over the substrate a patterned dielectric layer formed of a comparatively low dielectric constant dielectric material;
    forming aligned upon the patterned dielectric layer a patterned capping layer formed of a carbon doped silicon oxide dielectric material formed employing a plasma enhanced chemical vapor deposition (PECVD) method in turn employing an organosilane carbon and silicon source material, a substrate temperature of from about 0 to about 150 degrees centigrade and a radio frequency deposition power of from about 100 to about 500 watts per square centimeter substrate area, the patterned dielectric layer and the patterned capping layer defining an aperture; and
    forming into the aperture a patterned conductor layer while employing a damascene method.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the substrate is a semiconductor substrate employed within a semiconductor integrated circuit microelectronic fabrication.

4. The method of claim 1 wherein the comparatively low dielectric constant dielectric material is selected from the group consisting of spin-on-glass (SOG) dielectric materials, spin-on-polymer (SOP) dielectric materials, nanoporous dielectric materials, amorphous carbon dielectric materials and fluorosilicate glass dielectric materials.

5. The method of claim 1 wherein the comparatively low dielectric constant dielectric material is a nanoporous dielectric material.

6. The method of claim 1 wherein the patterned dielectric layer is formed to a thickness of from about 1000 to about 10000 angstroms.

7. The method of claim 1 wherein a remaining portion of the thickness of the patterned capping layer is from about 100 to about 1000 angstroms.

8. The method of claim 1 wherein the damascene method is a dual damascene method.

9. The method of claim 1 wherein the patterned conductor layer is formed from a conductor material selected from the group consisting of aluminum, aluminum alloy, copper and copper alloy conductor materials.

10. The method of claim 1 wherein the patterned conductor layer is formed from a copper or copper alloy conductor material.

11. A damascene method for forming a patterned conductor layer comprising:

providing a substrate;

forming over the substrate a patterned dielectric layer formed of a comparatively low dielectric constant dielectric material;

forming aligned upon the patterned dielectric layer a patterned capping layer formed of a carbon doped silicon oxide dielectric material formed employing a plasma enhanced chemical vapor deposition (PECVD) method in turn employing an organosilane carbon and silicon source material, a substrate temperature of from about 0 to about 150 degrees centigrade, the patterned dielectric layer and the patterned capping layer defining an aperture; and forming into the aperture a patterned conductor layer while employing a damascene method wherein the patterned capping layer provides for attenuated abrasive damage to the patterned dielectric layer when forming into the aperture the patterned conductor layer while employing the damascene method and a portion of the thickness of the patterned capping layer is removed when forming into the aperture into the aperture the patterned conductor layer while employing the damascene method.

12. The method of claim 11 wherein the substrate is a semiconductor substrate employed within a semiconductor integrated circuit microelectronic fabrication.

13. The method of claim 11 wherein the comparatively low dielectric constant dielectric material is selected from the group consisting of spin-on-glass (SOG) dielectric materials, spin-on-polymer (SOP) dielectric materials, nanoporous dielectric materials, amorphous carbon dielectric materials and fluorosilicate glass dielectric materials.

14. The method of claim 11 wherein the comparatively low dielectric constant dielectric material is a nanoporous dielectric material.

15. The method of claim 11 wherein the patterned conductor layer is formed from a conductor material selected from the group consisting of aluminum, aluminum alloy, copper and copper alloy conductor materials.

* * * * *